United States Patent
Sumioka

(10) Patent No.: US 8,342,381 B2
(45) Date of Patent: Jan. 1, 2013

(54) SOLDER FEEDER, PRINTER, AND PRINTING METHOD

(75) Inventor: Kouichi Sumioka, Shizuoka (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 0 days.

(21) Appl. No.: 13/140,606

(22) PCT Filed: Jan. 28, 2010

(86) PCT No.: PCT/JP2010/051116
§ 371 (c)(1),
(2), (4) Date: Jun. 17, 2011

(87) PCT Pub. No.: WO2010/090121
PCT Pub. Date: Aug. 12, 2010

(65) Prior Publication Data
US 2012/0138664 A1   Jun. 7, 2012

(30) Foreign Application Priority Data
Feb. 9, 2009   (JP) ................................. 2009-027310

(51) Int. Cl.
*B23K 31/02* (2006.01)
(52) U.S. Cl. ............... 228/102; 228/11; 228/22; 228/33; 228/248.1
(58) Field of Classification Search .................. None
See application file for complete search history.

(56) References Cited

U.S. PATENT DOCUMENTS

| | | | | |
|---|---|---|---|---|
| 5,201,452 A | * | 4/1993 | Takahashi et al. ................ | 228/8 |
| 5,452,655 A | * | 9/1995 | Tani ............................... | 101/123 |
| 5,479,854 A | * | 1/1996 | Chikahisa et al. ............. | 101/123 |
| 6,454,154 B1 | * | 9/2002 | Pedigo ............................ | 228/33 |
| 6,725,769 B1 | * | 4/2004 | Williams ....................... | 101/123 |
| 2001/0038882 A1 | * | 11/2001 | Onishi et al. .................... | 427/96 |

(Continued)

FOREIGN PATENT DOCUMENTS

EP           640492 A1  *  3/1995

(Continued)

OTHER PUBLICATIONS

International Search Report; PCT/JP2010/051116; Mar. 30, 2010.

*Primary Examiner* — Kiley Stoner
(74) *Attorney, Agent, or Firm* — Studebaker & Brackett PC; Donald R. Studebaker

(57) ABSTRACT

Disclosed is a print technology in which a solder pool staying on the surface of a mask is driven by means of a squeegee, and solder is applied onto a substrate onto which the lower surface of a mask is placed. A forward print process where solder is applied by driving a squeegee in a predetermined forward direction relative to a mask, and a backward print process where the solder is applied by driving the squeegee in a returning direction opposite to the forward direction are switched alternately. When the squeegee passes through the solder pool on the downstream side in a moving direction before switching in the course of switching from any one of the forward and backward print processes to the other one of these processes, the amount of solder in the solder pool is measured. Based on the amount of solder thus measured, the necessity of replenishing solder is determined. The solder pool is supplemented with solder, based on the result of the decision on whether solder replenishment is required.

5 Claims, 11 Drawing Sheets

U.S. PATENT DOCUMENTS

| | | | |
|---|---|---|---|
| 2004/0108368 A1* | 6/2004 | Onishi et al. | 228/248.1 |
| 2004/0244613 A1* | 12/2004 | Barajas et al. | 101/130 |
| 2006/0011075 A1* | 1/2006 | Claiborne | 101/126 |
| 2006/0272521 A1* | 12/2006 | Kato et al. | 101/123 |

FOREIGN PATENT DOCUMENTS

| | | | |
|---|---|---|---|
| JP | 05-261892 A | * | 10/1993 |
| JP | 06-023945 | | 2/1994 |
| JP | 06-191011 A | * | 7/1994 |
| JP | 08-207243 | | 8/1996 |
| JP | 10-006153 | | 1/1998 |
| JP | 11-138747 | | 5/1999 |
| JP | 2002-283536 A | | 10/2002 |
| JP | 2002-283536 A | * | 10/2002 |
| JP | 2006-076000 A | | 3/2006 |
| JP | 2007-136960 A | | 6/2007 |

* cited by examiner

FIG.10

| SUBSTRATE REPLACEMENT | PRINTING OPERATIONS & OPERATIONS ASSOCIATED WITH SOLDERING | FIRST EMBODIMENT | SECOND EMBODIMENT | THIRD EMBODIMENT | FOURTH EMBODIMENT |
|---|---|---|---|---|---|
| | PREPARATION PROCESS | ○ | ○ | ○ | ○ |
| | FORWARD PRINTING (REAR SIDE → FRONT SIDE) | ○ | ○ | ○ | ○ |
| SUBSTRATE REPLACEMENT | MEASURING THE AMOUNT OF SOLDER ON THE FRONT SIDE | ○ | | ○ | |
| SUBSTRATE REPLACEMENT | DETERMINING WHETHER SOLDER NEEDS TO BE REPLENISHED ON THE FRONT SIDE | ○--⌐ | | ○--⌐ | |
| SUBSTRATE REPLACEMENT | REPLENISHING SOLDER ON THE FRONT SIDE | ○←⌐ | | | |
| | MOVING TO BACKWARD PRINTING START POSITION | ○ | ○ | ○ | ○ |
| | BACKWARD PRINTING (FRONT SIDE → REAR SIDE) | ○ | ○ | ○ | ○ |
| SUBSTRATE REPLACEMENT | MEASURING THE AMOUNT OF SOLDER ON THE REAR SIDE | ○ | ○ | | ○ |
| SUBSTRATE REPLACEMENT | DETERMINING WHETHER SOLDER NEEDS TO BE REPLENISHED ON THE REAR SIDE | ○--⌐ | ○--⌐ | | ○--⌐ |
| SUBSTRATE REPLACEMENT | REPLENISHING SOLDER ON THE REAR SIDE | ○←⌐ | ○←⌐ | ○←⌐ | ○←⌐ |
| | MOVING TO FORWARD PRINTING START POSITION | ○ | ○ | ○ | ○ |
| | FORWARD PRINTING (REAR SIDE → FRONT SIDE) | ○ | ○ | ○ | ○ |
| SUBSTRATE REPLACEMENT | MEASURING THE AMOUNT OF SOLDER ON THE FRONT SIDE | ○ | | ○ | |
| SUBSTRATE REPLACEMENT | DETERMINING WHETHER SOLDER NEEDS TO BE REPLENISHED ON THE FRONT SIDE | ○--⌐ | | ○--⌐ | |
| SUBSTRATE REPLACEMENT | REPLENISHING SOLDER ON THE FRONT SIDE | ○←⌐ | | | |
| | MOVING TO BACKWARD PRINTING START POSITION | ○ | ○ | ○ | ○ |
| | BACKWARD PRINTING (FRONT SIDE → REAR SIDE) | ○ | ○ | ○ | ○ |
| SUBSTRATE REPLACEMENT | MEASURING THE AMOUNT OF SOLDER ON THE REAR SIDE | ○ | ○ | | |
| SUBSTRATE REPLACEMENT | DETERMINING WHETHER SOLDER NEEDS TO BE REPLENISHED ON THE REAR SIDE | ○--⌐ | ○--⌐ | | |
| SUBSTRATE REPLACEMENT | REPLENISHING SOLDER ON THE REAR SIDE | ○←⌐ | ○←⌐ | ○←⌐ | |
| | MOVING TO FORWARD PRINTING START POSITION | ○ | ○ | ○ | ○ |
| | ⋮ | | | | |
| | FORWARD PRINTING (REAR SIDE → FRONT SIDE) | ○ | ○ | ○ | ○ |
| SUBSTRATE REPLACEMENT | MEASURING THE AMOUNT OF SOLDER ON THE FRONT SIDE | ○ | | ○ | |
| SUBSTRATE REPLACEMENT | DETERMINING WHETHER SOLDER NEEDS TO BE REPLENISHED ON THE FRONT SIDE | ○--⌐ | | ○--⌐ | |
| SUBSTRATE REPLACEMENT | REPLENISHING SOLDER ON THE FRONT SIDE | ○←⌐ | | | |
| | MOVING TO BACKWARD PRINTING START POSITION | ○ | ○ | ○ | ○ |
| | BACKWARD PRINTING (FRONT SIDE → REAR SIDE) | ○ | ○ | ○ | ○ |
| SUBSTRATE REPLACEMENT | MEASURING THE AMOUNT OF SOLDER ON THE REAR SIDE | ○ | ○ | | ○ |
| SUBSTRATE REPLACEMENT | DETERMINING WHETHER SOLDER NEEDS TO BE REPLENISHED ON THE REAR SIDE | ○--⌐ | ○--⌐ | | ○--⌐ |
| SUBSTRATE REPLACEMENT | REPLENISHING SOLDER ON THE REAR SIDE | ○←⌐ | ○←⌐ | ○←⌐ | ○←⌐ |
| | MOVING TO FORWARD PRINTING START POSITION | ○ | ○ | ○ | ○ |
| | ⋮ | | | | |

THE DASHED ARROWS REPRESENT THE BASIS FOR DETERMINATION ON THE SOLDER TO BE REPLENISHED.

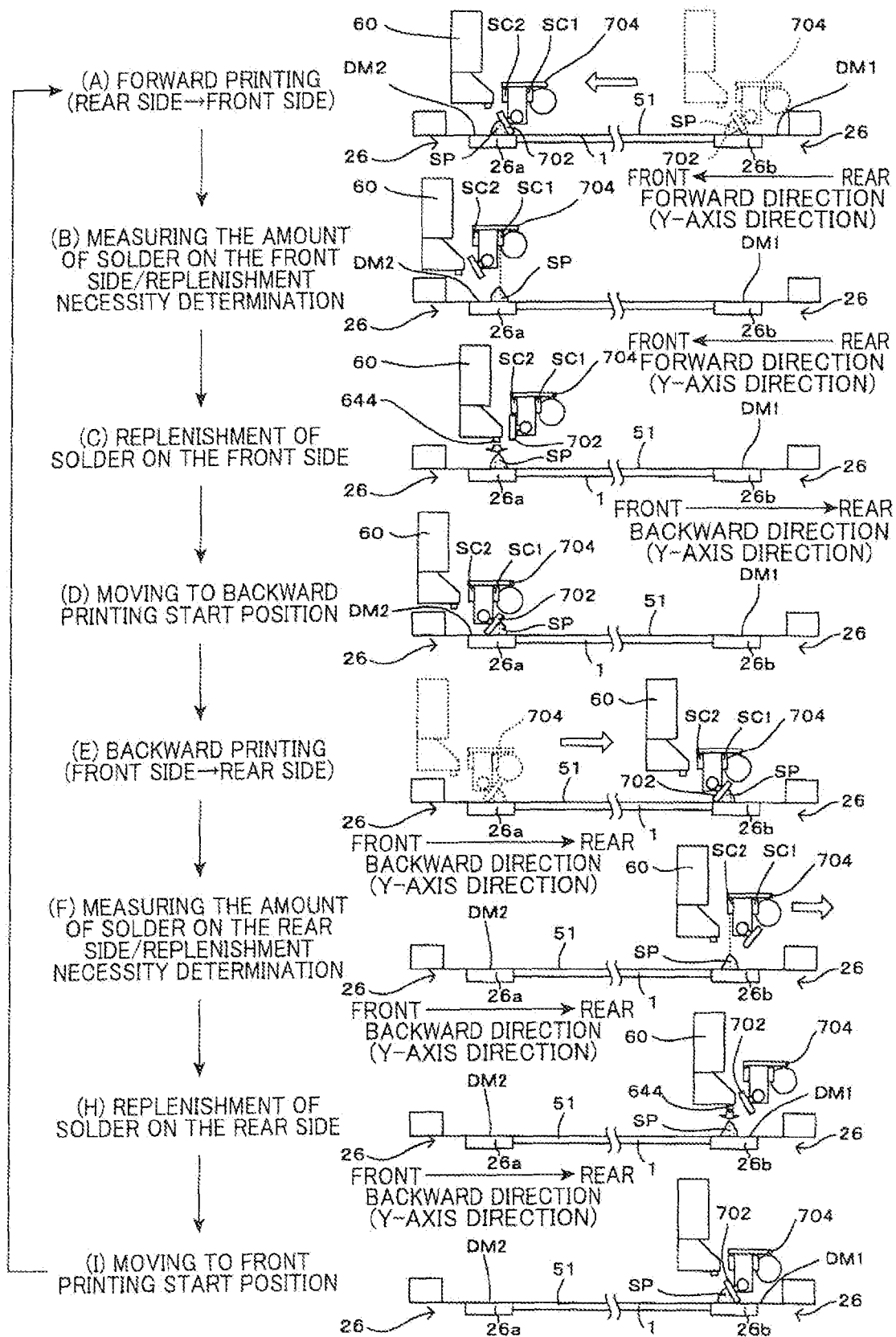

SOLDER FEEDER, PRINTER, AND PRINTING METHOD

TECHNICAL FIELD

The present invention relates to a print technology for applying solder onto a substrate through a mask of which lower surface is put on the top of the substrate, by pressing a solder pool staying on the surface of the mask using a squeegee while sliding the squeegee on the surface of the mask in order to apply solder, and, more particularly, relates to a technology for replenishing the solder pool with solder.

BACKGROUND ART

There has been generally known a conventional printer in which a mask is put on the top of a substrate. A solder pool staying on the surface of the mask is pressed and moved on the surface of the mask by a squeegee, whereby solder is applied (printed) onto a predetermined position on the substrate through an opening part formed on the mask. In this printer, the solder pool is formed by accumulating solder that is substantially greater in amount than solder used on a single substrate. When printing using this solder pool, the solder is consumed by repeated printing, and consequently the solder residue in the solder pool decreases gradually. There has been proposed a technology for using a sensor to detect the solder residue in the solder pool and automatically replenishing the solder pool with solder based on the detection result (see Patent Document 1, for example).

Patent Document 1: Japanese Patent Application Publication H6-23945 (Paragraph 0018, FIG. 1)

DISCLOSURE OF THE INVENTION

In the printer described in Patent Document 1, a pair of squeegees with different directions of tilt is alternately used for pressing a solder pool, by reciprocally moving the pair of squeegees along the surface of a mask. Specifically, one of the pair of squeegees is moved in a forward direction while pressing the solder pool during the forward movement of the pair of squeegees, whereas the other squeegee is moved in a returning direction while pressing the solder pool during the backward movement of the pair of squeegees. This means that the solder pool constantly moves back and forth between the pair of squeegees. A sensor is disposed in the vicinity of the forward-moving squeegee to detect the solder pool. Solder replenishment is performed based on the result of the detection. Therefore, the moving range of the pair of squeegees needs to be set in consideration of the following situation. In other words, in order to detect the solder residue in the solder pool after performing a backward print process in which the backward-moving squeegee is moved in the returning direction, both the forward-moving squeegee and the backward-moving squeegee need to be directed in the forward direction again, to bring the sensor close to the solder pool.

Here, if the pair of squeegees is directed in the opposite direction immediately after the backward print process, the abovementioned other squeegee moves toward an opening part of a mask. When the solder drips from this other squeegee during or after the movement of the squeegees then, the dripping solder adheres to the substrate through the opening part of the mask. In this case, if the position of the substrate is not accurately positioned to the mask, the dripping solder might adhere to an inappropriate section of the substrate (a section where the solder is not supposed to be applied). In order to avoid such a problem, the execution of solder detection and solder replenishment after positioning the substrate is considered. However, employing such an operation sequence causes delay in start of the subsequent printing due to the solder detection and replenishment, resulting in cycle loss.

In order to avoid the problem described above, it is also considered to remain the movement of the pair of squeegees by a constant distance in the returning direction even after the backward print process so as to move the solder pool toward a non-opening part of the mask, and then directing the pair of squeegees in the opposite direction again to bring the sensor close to the solder pool. However, it is necessary to set a region in the mask for ensuring the pair of squeegees to overrun in the returning direction so that the solder pool is moved toward the non-opening part. This narrows down a region to be provided with the opening part. In other words, a limit needs to be set on the size of the substrate, causing a reduction in the versatility of the device.

The present invention is contrived in view of the problems described above, and an object thereof is to provide a solder feeder capable of regulating the solder residue in a solder pool used in solder printing, without limiting the size of a substrate or causing cycle loss. The present invention also aims to provide a printer and printing method as well.

A solder feeder according to the present invention is a solder feeder which replenishes a solder pool with solder, the solder feeder is equipped with a printer, the printer executes, alternately, a forward print process in which a squeegee, supported on a head, presses a solder pool staying on a surface of a mask from the upstream side in a forward direction while moving the head relatively along the surface of the mask in the forward direction, in order to apply solder onto a substrate through the opening part of the mask of which lower surface is put on the top of the substrate, and a backward print process in which the squeegee presses the solder pool from the upstream side in a returning direction while moving the head relatively along the surface of the mask, in order to apply solder onto a substrate through the opening part of the mask. The solder feeder is provided with: solder feeding means for feeding the solder; solder amount measuring means, attached to the head, for measuring an amount of solder in the solder pool when the squeegee passes through the solder pool on the downstream side in a moving direction before switching in a process where switching is made from any one of the forward print process and backward print process to the other; solder replenishment necessity determination means for determining whether solder replenishment is required, based on the amount of solder measured by the solder amount measuring means; and replenishment control means for controlling the solder feeding means to replenish the solder pool with the solder, based on a result of the determination made by the solder replenishment necessity determination means.

A printer according to the present invention is provided with: printing means for executing alternately a forward print process in which a squeegee supported on a head presses a solder pool staying on a surface of the mask from the upstream side in a forward direction while moving the head relatively along the surface of the mask in the forward direction, in order to apply solder onto a substrate through the opening part of the mask of which lower surface is put on the top of the substrate, and a backward print process in which the squeegee presses the solder pool from the upstream side in a returning direction while moving the head relatively along the surface of the mask, in order to apply solder onto a substrate through the opening part of the mask; solder feeding means for feeding the solder; solder amount measuring means, attached to the head, for measuring an amount of solder in the solder pool when the squeegee passes through the solder pool on the downstream side in a moving direction before switching in a process where switching is made from any one of the forward print process and backward print process to the other; solder replenishment necessity determination means for determining whether the solder pool needs to be replenished with solder, based on a result of the measurement performed by the solder amount measuring means; and replenishment control means for controlling the solder feeding means to replenish the solder pool with the solder, based on a result of the determination made by the solder replenishment necessity determination means.

A printing method according to the present invention is provided with steps of: a forward print process in which a squeegee supported on a head presses a solder pool staying on the surface of the mask from the upstream side in a forward direction while moving the head relatively along the surface of the mask in the forward direction, in order to apply solder onto a substrate through the opening part of the mask of which lower surface is put on the top of the substrate; a backward print process in which the squeegee presses the solder pool from the upstream side in a returning direction while moving the head relatively along the surface of the mask in the returning direction, in order to apply solder onto a substrate through the opening part of the mask; a switching process of switching a position of the squeegee in relation to the solder pool when alternately switching between the forward print process and the backward print process; a solder amount measuring process of measuring an amount of solder in the solder pool when the squeegee passes through the solder pool on the downstream side in a moving direction before switching in a process where switching is made from any one of the forward print process and backward print process to the other; a solder replenishment necessity determination process of determining whether solder replenishment is required, based on a result of the measurement performed in the solder amount measuring process; and a replenishing process of replenishing the solder pool with the solder, based on a result of the determination made in the solder replenishment necessity determination process.

According to the present inventions (the solder feeder, the printer, and the printing method) configured as above, the forward print process and the backward print process are performed by a single squeegee, and the squeegee is switched and moved at a timing of switching between the forward print process and the backward print process. When the squeegee passes through the solder pool at the downstream in the moving direction prior to the switching in the course of switching from any one of the forward print process and the backward print process to the other, the amount of solder in the solder pool is measured. Based on the measured amount of solder, it is determined as to whether replenishment of the solder is necessary or not. Thus, even if the solder adhered to the squeegee drips during the solder amount measurement, the drop of the solder adheres to a non-opening part of the mask. For this reason, the amount of solder in the solder pool can be measured without employing the operation sequence that causes cycle loss. Moreover, it is no longer necessary to cause the squeegee to overrun excessively at the non-opening part of the mask. Accordingly, the amount of solder in the solder pool can be measured in a short period of time during the solder printing processes regardless the masks having an opening part not only with a comparatively small region, but also with a comparatively large region. Judgment as to whether solder replenishment is required is determined based on the amount of solder that is measured as described above, and the solder pool is replenished with the solder as needed, whereby the solder pool is regulated.

As described above, according to the present invention, the amount of solder in the solder pool can be measured when the squeegee passes through the solder pool at the non-opening part of the mask at the time of switching. Therefore, the solder adhering to the squeegee during the measurement of the solder pool can be prevented from dripping on the opening part of the mask. Consequently, the amount of solder in the solder pool can be measured without employing the operation sequence causing cycle loss, whereby the occurrence of cycle loss can be prevented. Furthermore, the amount of solder in the solder pool can be measured during the operation of switching the position of the squeegee in relation to the solder pool, and the limit that is set on the size of the substrate in the prior art can be eliminated, enhancing the versatility. Based on the amount of solder measured as described above, the solder pool can be regulated by replenishing the solder pool with the solder as necessary.

BRIEF DESCRIPTION OF THE DRAWINGS

FIG. 7 FIG. 7A is a front view showing a solder feeding unit.

FIG. 10 is a diagram showing operation patterns executed by the solder feeder according to the present invention in relation to a plurality of embodiments.

FIG. 11 is a diagram, schematically showing operation processes (a) to (i) of another embodiment of the solder feeder according to the present invention.

BEST MODE FOR CARRYING OUT THE INVENTION

Figure 1:
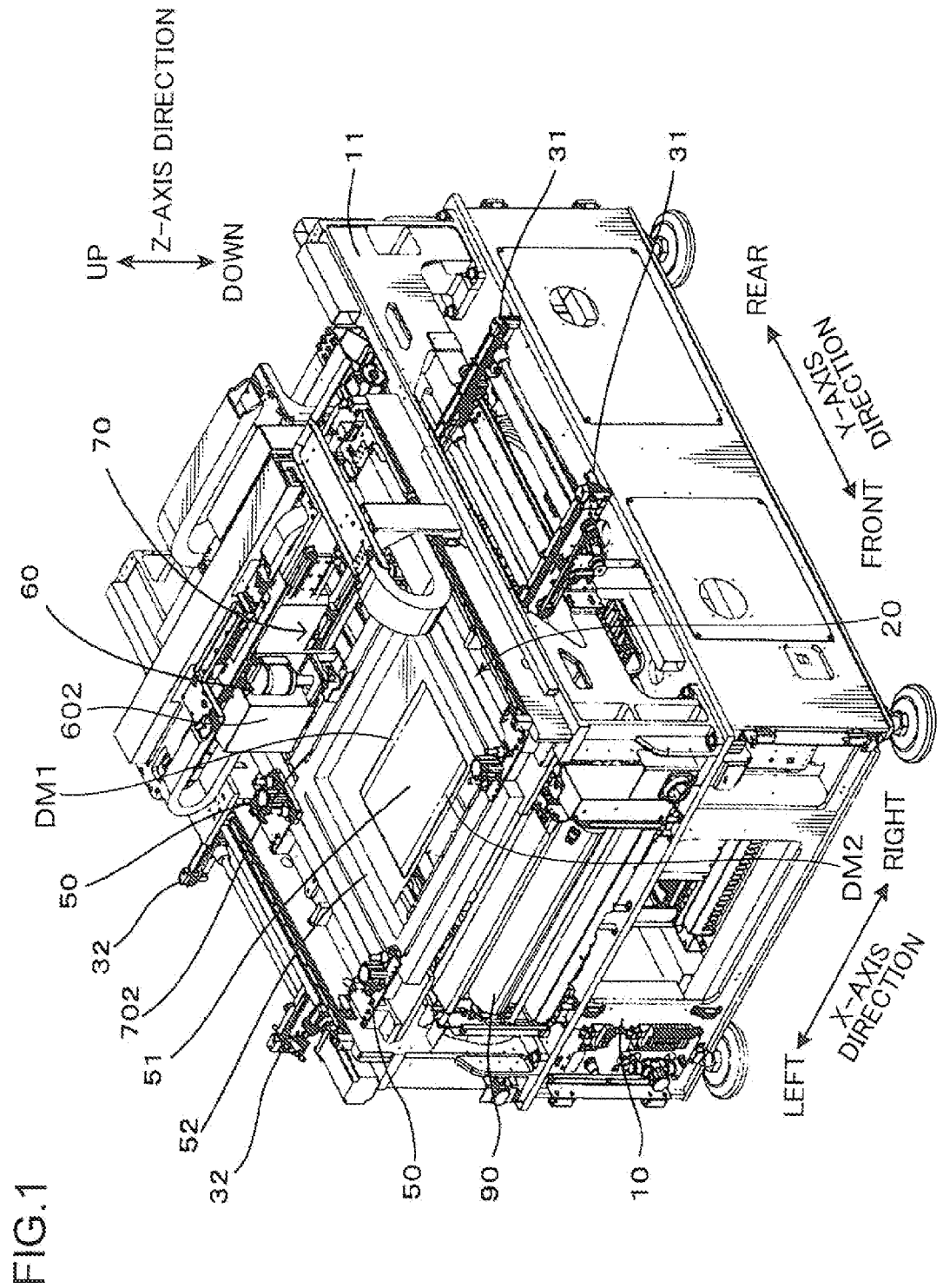
FIG. 1 is a perspective view showing a printer equipped with a first embodiment of a solder feeder according to the present invention.
Figure 2:
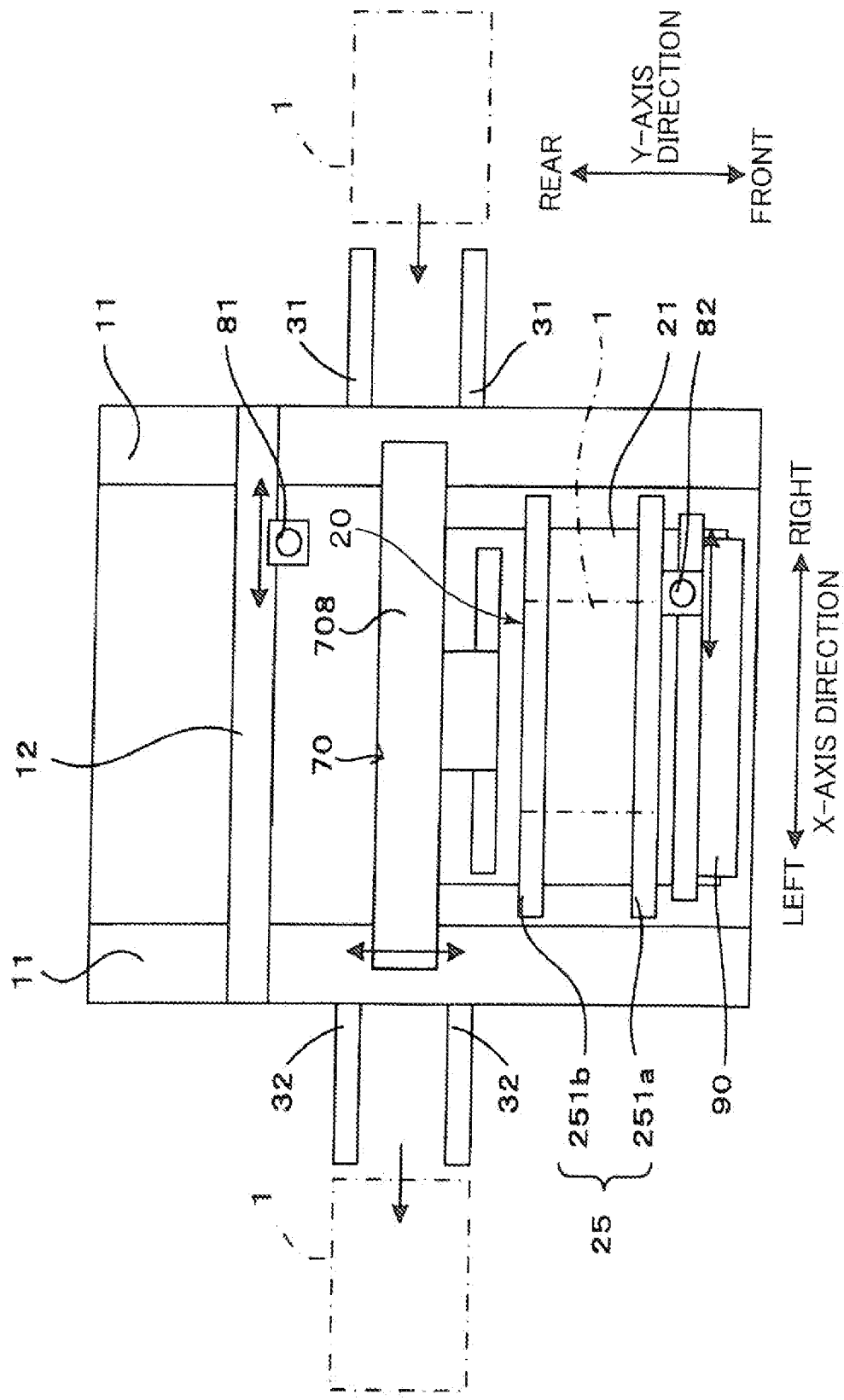
FIG. 2 is a plan view showing a schematic configuration of the printer without a mask.
Figure 3:
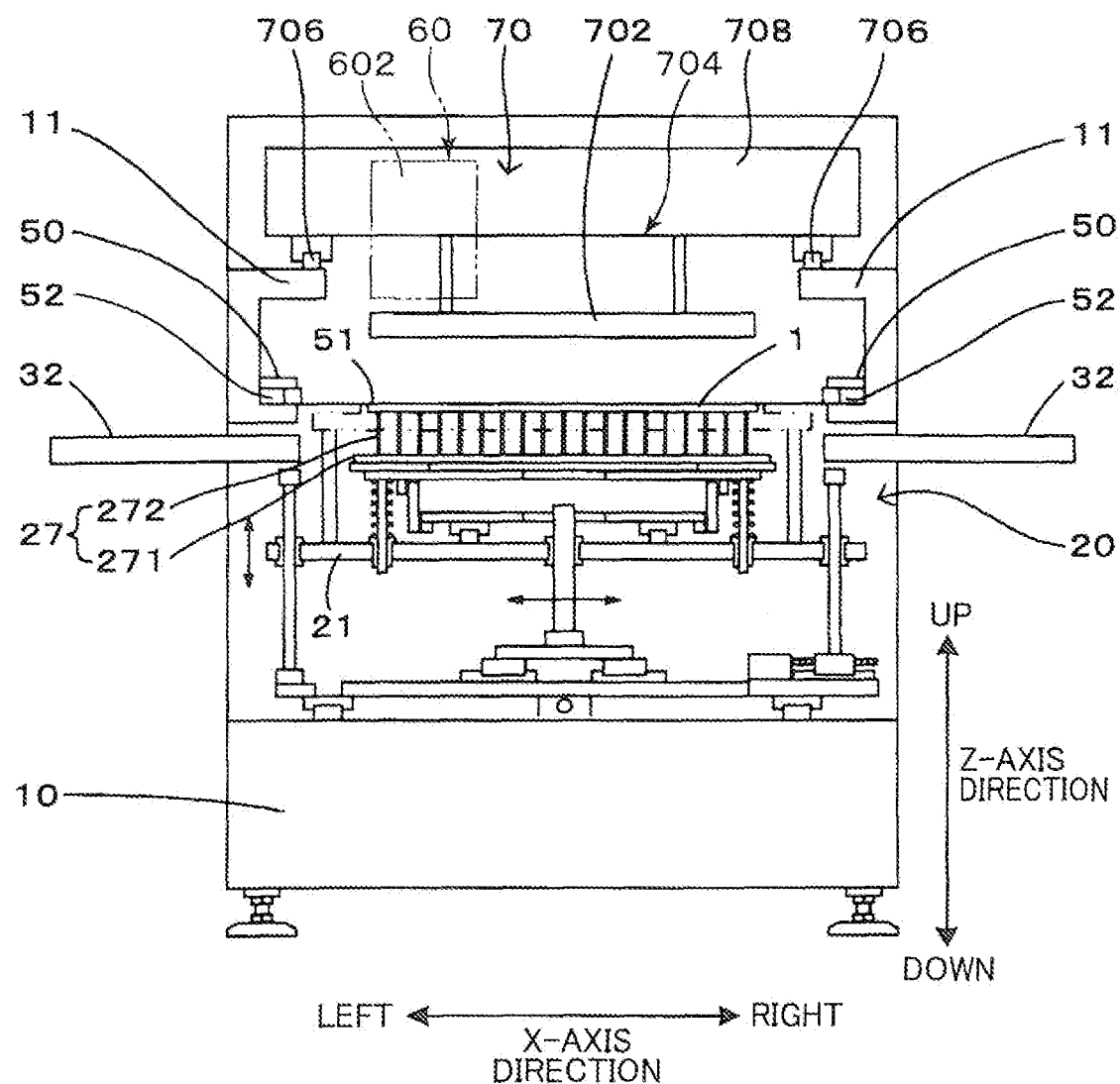
FIG. 3 is a side view showing a schematic configuration of the printer with the mask.

As shown in FIGS. 1 to 3, a printer according to a first embodiment of the present invention has a base 10 in substantially a quadrangle shape in a planar view, and a substrate delivery mechanism 20 that freely moves back and forth on the base 10 with respect to the printer. The substrate delivery mechanism 20 has a conveyor unit 25 that has a pair of main conveyors 251a, 251b capable of driving a substrate 1 on the base 10 side to side with respect to the printer. The printer also has carrying-in conveyors 31, 31 that are equipped with a right side of the base 10 and carry the unprocessed substrate 1 into the conveyor unit 25, carrying-out conveyors 32, 32 that are equipped with a left side of the base 10 and carry the processed substrate 1 out of the conveyor unit 25, and a control unit 40 that controls the entire printer (see FIG. 4). The substrate delivery mechanism 20, carrying-in conveyors 31, 31 and carrying-out conveyors 32, 32 are controlled by a substrate delivery mechanism controller 43 of the control unit 40 in a mutually cooperative manner. In the following description, the lateral direction of the printer is supposedly described as "X-axis direction," the front-back direction as "Y-axis direction," and the vertical direction as "Z-axis direction."

The substrate delivery mechanism 20 has a movable board 21 that is in a rectangular shape in a planar view. This movable board 21 is driven by a group of drive units, not shown, to be able to move horizontally along the Y-axis direction as well as up and down along the Z-axis direction, and to be able to rotate about the Z-axis. The conveyor unit 25, a substrate clamp unit 26 (see FIGS. 8 and 11), and backup unit 27 are provided on the movable board 21.

The main conveyors 251a, 251b of the conveyor unit 25 are distanced from each other in the Y-axis direction and extend in parallel in the X-axis direction to each other. The front conveyor 251a is supported by a front supporting member attached to the movable board 21, while the rear conveyor 251b is supported by a rear supporting member attached to the movable board 21.

Plate-like clamping pieces 26a, 26b (see FIGS. 8 and 11) forming the substrate clamp unit 26 are attached to the front and rear supporting members mentioned above. In order to support the sides of the substrate 1 on the conveyors 251a, 251b, the clamping pieces 26a, 26b are driven by activating an actuator, such as a cylinder, by means of the substrate delivery mechanism controller 43. Also, when the actuator is driven in the reverse direction, the substrate 1 supported from the sides thereof by the clamping pieces 26a, 26b are released.

As shown in FIG. 3, the backup unit 27 is disposed, between the abovementioned front and rear supporting members, on the movable board 21. The backup unit 27 has a backup plate 271 that is supported on the movable board 21 so as to be able to move up and down, a plurality of backup pins 272 that are provided upright to the backup plate 271, and a lifting mechanism part (not shown) that is disposed between the backup plate 271 and the movable board 21 and drives the backup plate 271 up and down. The backup pins 272 are capable of supporting a lower surface of the substrate 1 by using the tip end parts thereof. Activation of the lifting mechanism part by the substrate delivery mechanism controller 43 causes the backup plate 271 to move upward, whereby positioning the substrate 1 that is lifted up from the conveyors 251a, 251b. In other words, when the backup plate 271 is lifted up, the tip ends of the backup pins 272 come into contact against the substrate 1 on the conveyors 251a, 251b. When the backup plate 271 is further lifted up, the backup pins 272 bring the substrate 1 upward from the conveyors 251a, 251b while supporting the bottom of the lower surface of the substrate 1, so that an upper surface of the substrate 1 is flush with upper surfaces of the clamping pieces (backing up). On the other hand, when the backup plate 271 is lifted down, the substrate 1 is returned from the backup pins 272 to the conveyors 251a, 251b. When the backup plate 271 is further lifted down thereafter, the backup pins 272 retreat beneath the substrate 1.

Moreover, in this substrate delivery mechanism 20, the movements of the movable board 21, by the substrate delivery mechanism controller 43, in the X-axis direction, Y-axis direction, and a direction of rotating about the Z-axis, causes the substrate 1 that is backed up by the backup pins 272 and held by the clamping pieces as described above to be positioned in relation to a mask 51 of a mask clamp unit 50.

The carrying-in conveyors 31 are disposed in order to support and deliver, in the X-axis direction, the unprocessed substrate 1 onto which solder is to be printed. When the carrying-in conveyors 31, 31 are driven while the conveyors 251a, 251b on the substrate delivery mechanism 20 are positioned between the carrying-in conveyors 31, 31 and the carrying-out conveyors 32, 32, the unprocessed substrate 1 will be sent to the conveyors 251a, 251b on which the substrate delivery mechanism 20 is disposed. When the conveyors 251a, 251b receive the unprocessed substrate 1 that is sent from the carrying-in conveyors 31, 31, the height of the movable board 21 is adjusted to position the pair of conveyors 251a, 251b at the same level as the carrying-in conveyors 31, 31 and the carrying-out conveyors 32, 32 so as to align the conveyors 251a, 251b in the X-axis direction. Then, the conveyors 251a, 251b will be driven along with the carrying-in conveyors 31, 31.

The carrying-out conveyors 32 are disposed in order to carry-out, in the X-axis direction, the processed substrate 1 onto which the solder is printed while supporting the substrate 1. To deliver the processed substrate 1 on which the solder is printed to the carrying-out conveyors 32, 32, the conveyors 251a, 251b are driven together with the carrying-out conveyors 32, 32 after the substrate 1 is processed. Note that a Y-axis direction interval between the carrying-in conveyors 31 and 31, a Y-axis direction interval between the conveyors 251a and 251b, and a Y-axis direction interval between the carrying-out conveyors 32 and 32 can be changed by independent conveyor width adjusting devices respectively, which are not shown, and are adjusted in accordance with the width of the substrate 1 in a setup process prior to the start of printing.

The mask clamp unit 50 is for detachably fixing the mask 51 to frame members 11 that are fixed to the base 10. The mask 51 is formed by an operator's manipulation by pasting a thin stencil up on lower surfaces of mask frames (mask WAKU) 52. The mask frames 52 are fixed to the frame members 11 above the substrate delivery mechanism 20 by the mask clamp unit 50. As a result, the mask 51 is held above the substrate delivery mechanism 20. Opening parts though which solder passes are formed in the middle of the mask 51. Non-opening parts DM1, DM2 on which a solder pool SP can be placed are formed on at least both front and rear sides of the mask 51.

Solder feeding unit 60 and squeegee unit 70 are disposed above an upper position of the mask 51. In the solder feeding unit 60, each part of the solder feeding unit 60 is activated in response to a control command issued by a solder feed controller 44 of the control unit 40, whereby the solder is fed to the mask 51 and a solder pool is formed thereon or the solder is replenished to the solder pool. The squeegee unit 70 spreads the solder out on the mask 51 in response to a drive command sent by a squeegee controller 45 (see FIG. 4) of the control unit 40. The operation of the squeegee unit 70 allows to print the solder on the upper surface of the substrate 1 through the opening parts equipped with the mask 51. In the present embodiment, the solder feeding unit 60 corresponds to "solder feeder" or "solder feeding means" of the present invention. The squeegee unit 70 corresponds to "printing means" of the present invention. Note that the configurations and operations of the solder feeding unit 60 and squeegee unit 70 are described hereinafter in more detail.

Subsequent to the printing, the substrate delivery mechanism 20 is moved and positioned again between the carrying-in conveyors 31, 31 and the carrying-out conveyors 32, 32. After the processed substrate 1 is returned to the conveyors 251a, 251b by a reverse operation with respect to the abovementioned backup and substrate clamping operations, the conveyors 251a, 251b of the substrate delivery mechanism 20 are driven by the substrate delivery mechanism controller 43. The processed substrate 1 on which the printing is performed is then delivered to the carrying-out conveyors 32, 32. Thereafter, the carrying-out conveyors 32, 32 are driven to carry the processed substrate 1 out of the printer.

In the first embodiment, a substrate camera 81 for capturing images of a plurality of fiducial marks or the like on the substrate 1 is disposed movably in the X-axis direction along a beam 12 fixed to the frame members 11. The substrate delivery mechanism 20 also has a mask camera 82. The mask camera 82 moves in the X-axis direction in order to capture images of a plurality of fiducial marks (not shown) on a lower surface of the mask 51 and identify the position and type of the mask 51. Because the substrate delivery mechanism 20 is movable in the Y-axis direction, the substrate camera 81 and mask camera 82 can capture images of the plurality of fiducial marks that are separated from one another in the X-axis direction and the Y-axis direction, to recognize the positions thereof.

In addition, a cleaner 90 is attached to the front side of the substrate delivery mechanism 20 in the Y-axis direction. The cleaner 90 moves in the Y-axis direction when the substrate delivery mechanism 20 which moves in the Y-axis direction. This cleaner 90 is a device for cleaning and removing the solder etc. adhering to the mask 51 due to the solder printing performed on the substrate 1.

Figure 4:
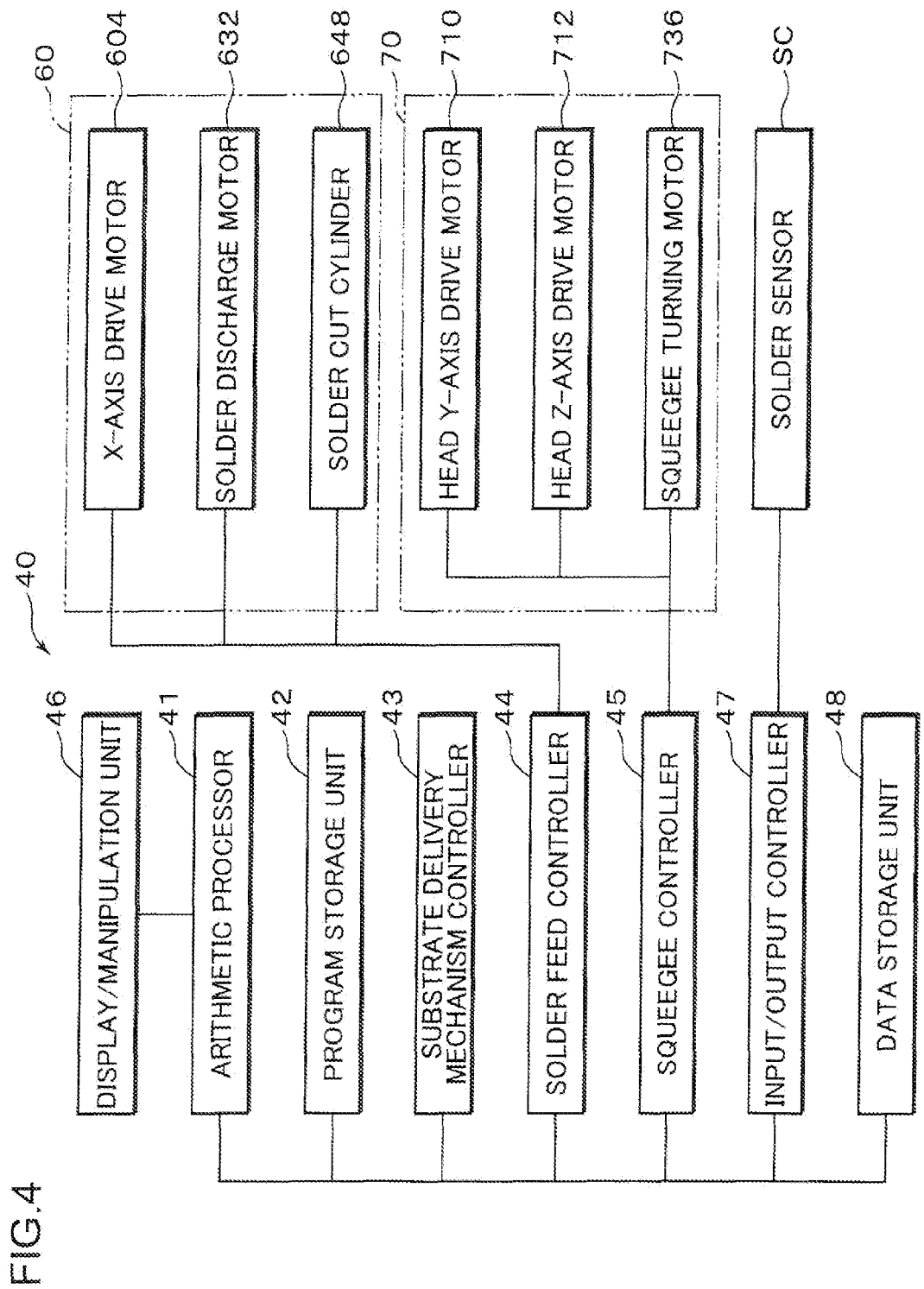
FIG. 4 is a block diagram showing a schematic configuration of a major part of the printer.

As shown in FIG. 4, the control unit 40 has an arithmetic processor 41, a program storage unit 42, the substrate delivery mechanism controller 43, the solder feed controller 44, and the squeegee controller 45. The arithmetic processor 41 is configured by a CPU and the like, and controls each part of the printer in accordance with a print program previously stored in the program storage unit 42, to repeatedly perform printing. The substrate delivery mechanism controller 43 controls various motors and the actuator such as an air cylinder that are embedded in the substrate delivery mechanism 20, to carry-in and carry-out the substrate 1 by means of the conveyors 251a, 251b, as well as to position the substrate 1 in relation to the mask 51. Also, the solder feed controller 44 controls the solder feeding unit 60, the detail of which is described below, to feed the solder to the mask 51. In addition, the squeegee controller 45 controls the operations of a squeegee 702. Note that a reference numeral 46 shown in the same diagram designates a display/manipulation unit for displaying the print program or an error message, and for allowing an operator to input various data items, commands and other types of information to the control unit 40. Reference numeral 47 designates an input/output controller for receiving a result of detection performed by a solder sensor detecting the solder on the mask 51, and sending the detection result to the arithmetic processor 41. Reference numeral 48 designates a data storage unit. Data required for controlling each part mentioned above are stored in the data storage unit 48, as well as the limit amount of solder with which the printing quality can be ensured, the initial solder discharge amount with which the solder pool SP is formed on the mask 51 in a preparation process that is described hereinafter, the reduction amount of solder consumed by single printing, the amount of solder measured in a solder amount measuring process, and a solder residue calculated based on the amount of solder.

The configuration and operations of the squeegee unit 70 are described next.

As shown in FIG. 3, the squeegee unit 70 has the squeegee 702 extending in the X-axis direction, and a print head 704 that rotatably supports a shaft of the squeegee 702. The print head 704 is supported so as to be movable in the Y-axis direction and the Z-axis direction and driven by a servomotor. In other words, a pair of fixed rails 706 is provided at the top of the frame members 11 along the Y-axis, and a head supporting member 708 is laid laterally so as to be movable in the Y-axis direction with respect to the fixed rails 706. At the time of the activation, a head Y-axis drive motor 710 is activated in response to a control command issued by the squeegee controller 45, whereby the head supporting member 708 moves in the Y-axis direction. In addition, the print head 704 is coupled to this head supporting member 708 so as to be movable in the Z-axis direction. A head Z-axis drive motor 712 is activated in response to a control command issued by the squeegee controller 45, whereby the print head 704 moves in the Z-axis direction. In the first embodiment, the one with a single squeegee described in Japanese Patent Application Publication No. 2007-136960, for example, is used as the print head 704. The detail of it is described next.

Figure 5:
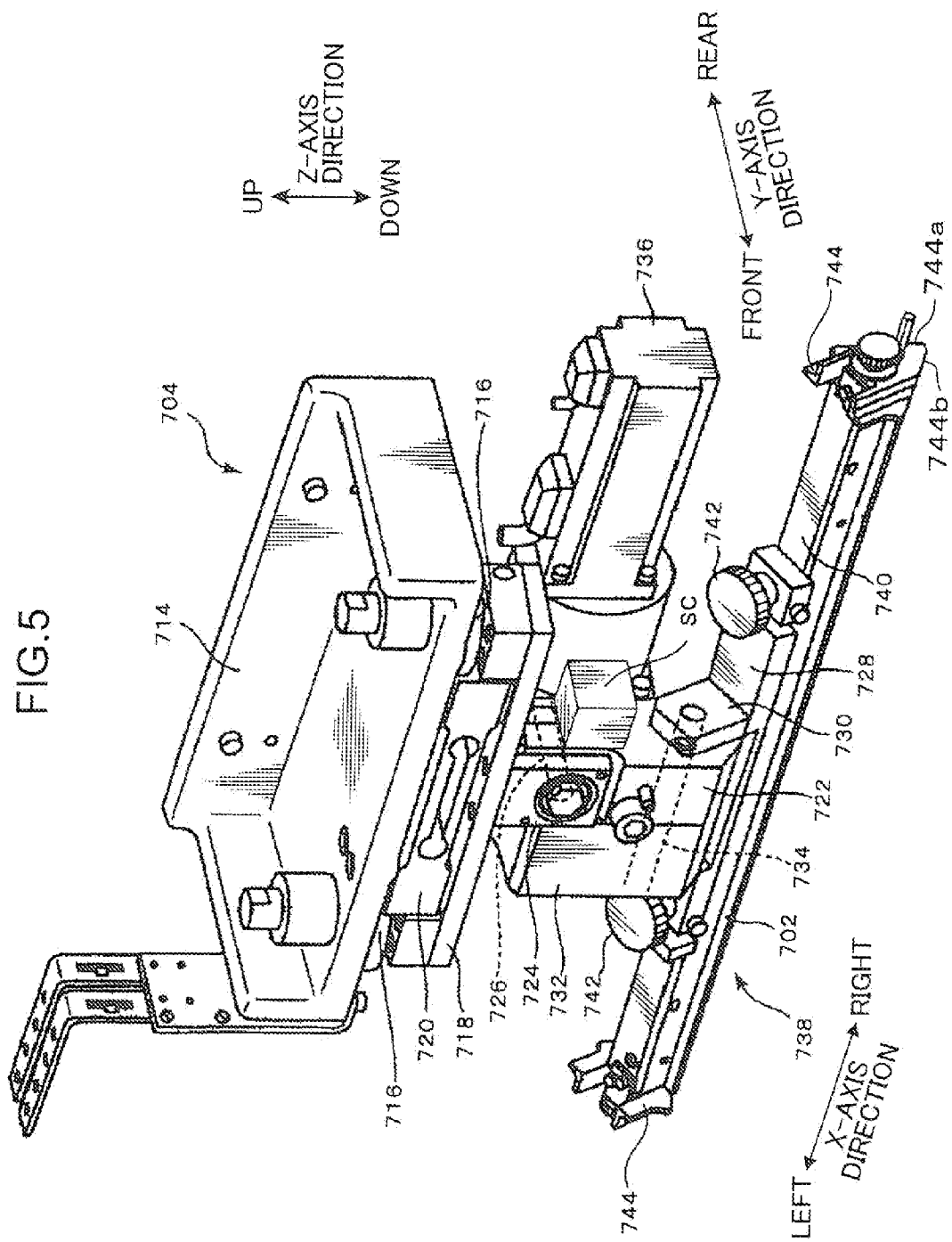
FIG. 5 is a perspective view showing a specific configuration of a print head.
Figure 6:
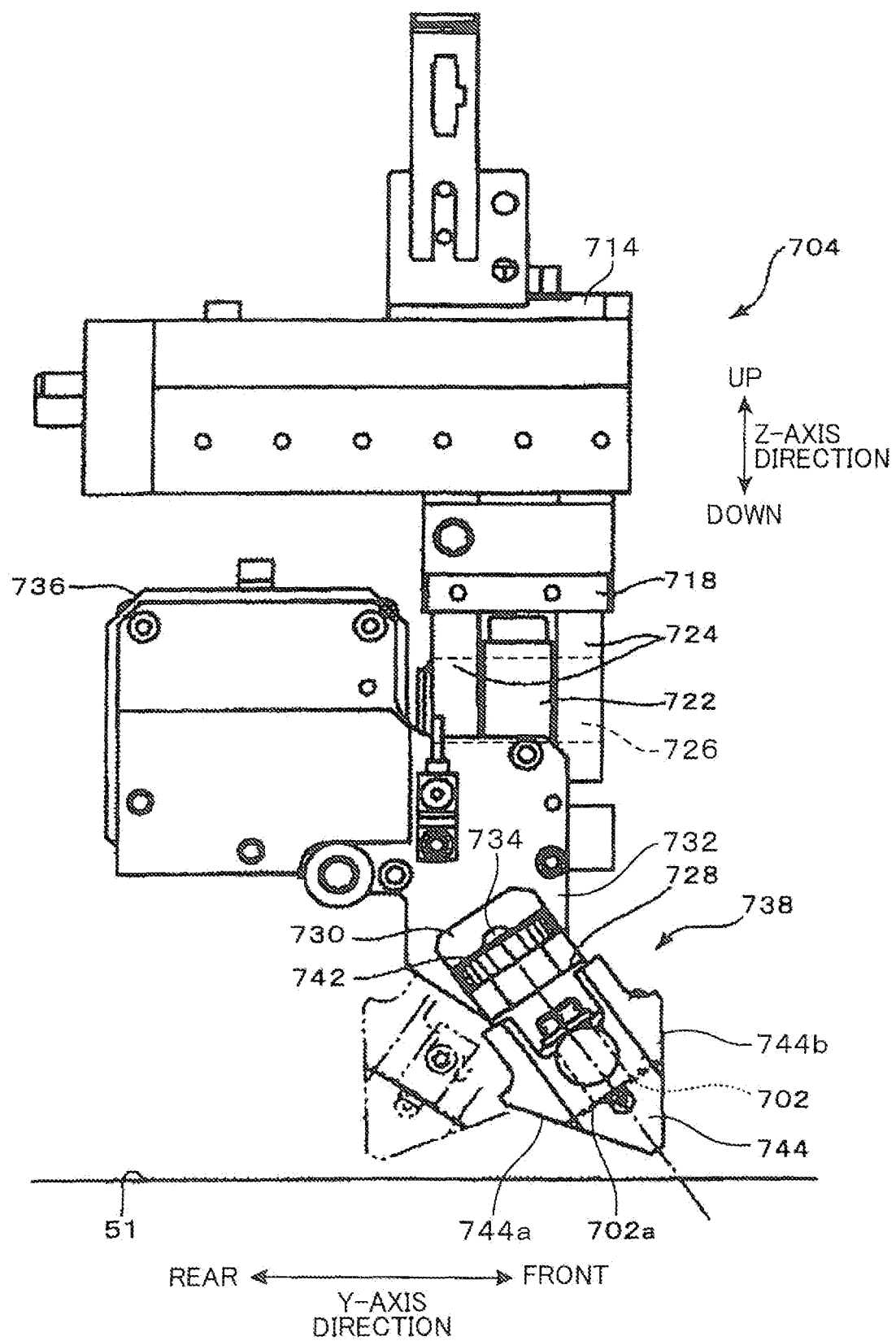
FIG. 6 is a side view of a specific configuration of the print head.

As shown in FIGS. 5 and 6, the print head 704 has a main frame 714 that is fixed to the head supporting member 708 through a stay 713. This main frame 714 is made of aluminum or the like, and, on its lower side, a supporting board 718 is coupled thereto via a sliding strut 716 so as to be displaceable in the Z-axis direction. A load sensor 720 of a load cell or the like is interposed between the supporting board 718 and the main frame 714. The supporting board 718 supports a sub frame 722 disposed below the board 718 so as to allow the sub frame 722 to swing freely around an axis parallel to the Y-axis. More specifically, a pair of suspension parts 724 is disposed on a lower part (on a lower surface) of the supporting board 718. A first support shaft 726 penetrating the suspension parts 724 in the Y-axis direction is supported rotatably by a bearing or the like, and the sub frame 722 is mounted on to the first support shaft 726. Accordingly, the frame 722 is supported freely to swing around the axis parallel to the Y-axis.

The sub frame 722 is provided with a unit assembling part 728 rotatably and a drive mechanism that drives the unit assembling part 728. The unit assembling part 728, which is a rectangular plate-like member stretched out in the X-axis direction, is supported rotatably on the sub frame 722 via a pair of unit supporting parts 730 formed at the intermediate of a longitudinal direction of the unit assembling part 728 in a protruding manner. Specifically, a second support shaft 734 extending in the X-axis direction is supported rotatably on the sub frame 722 by a bearing or the like, and the unit supporting parts 730 of the unit assembling part 728 are fixed to both end sections of the second support shaft 734. In this manner, the unit assembling part 728 is supported on the sub frame 722 so as to be able to swing freely around the X-axis.

A gear box 732 is integrally incorporated in the sub frame 722, wherein one end of the second support shaft 734 (the end part on the left-hand side of FIG. 6) penetrates the gear box 732 and protrudes to the outside. Therefore, each of the unit supporting parts 730 of the unit assembling part 728 is fixed to the second support shaft 734 at both sub frame 722 and gear box 732 sides. Furthermore, at the above one of supporting parts 730, which is located on the opposite side of the gear box 732, a solder sensor SC is disposed on the side surface of the sub frame 722, for detecting, at the right-hand side in FIG. 5 with respect to the unit supporting part 730, the solder pool staying on the surface of the lower mask 51. A signal that indicates a result of the measurement of the solder pool performed by the solder sensor SC is input to the input/output controller 47. In the present embodiment, the sensor SC functions as the "solder amount measuring means" of the present invention.

A transmission gear (not shown) is fixed to the part of the second support shaft 734 that is inserted within the gear box 732. This transmission gear meshes with an idle gear (not shown) supported within the gear box 732. A squeegee turning motor 736 as a drive source is disposed at a rear section of the sub frame 722 and fixed to a side surface of the gear box 732. An output shaft of the squeegee turning motor 736 is inserted into the gear box 732. The inserted part of the output shaft supports a drive gear (not shown) meshing with the idle gear. When the squeegee turning motor 736 is activated, the generated drive force is transmitted to the second support shaft 734 via each of the gears. As a result, the unit assembling part 728 is turned and driven around the second support shaft 734. In other words, the drive mechanism of the unit assembling part 728 described above is configured by the squeegee turning motor 736, each of the gears, the second support shaft 734, and the like.

A squeegee assembly 738 is incorporated detachably in the unit assembling part 728. This squeegee assembly 738 is configured by the squeegee 702 and a squeegee holder 740 holding the squeegee 702. To fix the squeegee assembly 738 to the unit assembling part 728, a pair of screw shafts (not shown in figures) provided with the squeegee holder 740 passes through a guide groove formed in the unit assembling part 728, the squeegee holder 740 is put on the top of the unit assembling part 728, and, in this state, a nut member 742 with a knob is threadably mounted in each of the screw shafts.

The squeeze 702 is an elastically moderated polymeric material such as urethane rubber, polyacetal, polyethylene, or polyester (urethane rubber is employed in the present embodiment), which is formed into a plate-like member stretched out in the X-axis direction. One side of the squeegee 702 is placed and fixed on the squeegee holder 740, which is also stretched out in the X-axis direction. The other side of the squeegee 702A forms thereon a flat working surface 702a for scrapping off the solder. The activation of the squeegee turning motor 736 in response to a control command issued by the squeegee controller 45 can alternatively direct the working surface of the squeegee 702 to either the upstream side of the Y-axis direction or the downstream side of the Y-axis direction. Consequently, the same working surface 702a can be used to scrape off the solder in a forward print process and backward print process, which will be described hereinafter. In order to match a load detected by the load sensor 720 with a target printing load (the load obtained by the squeegee 702 pressing the substrate 1 or clamping pieces 26a, 26b by means of the mask 51), the squeegee controller 45 performs, during the forward print process and the backward print process, feedback-control on the head Z-axis drive motor 712.

Sideward leakage baffles 744 are pivotably attached to both end parts of the squeegee holder 740. The sideward leakage baffles 744 are held by the squeegee holder 740, such that, when the print head 704 is in a lifted-up position, the centerlines of the sideward leakage baffles 744 intersect perpendicularly with the working surface 702a due to the urging force of a twisted spring, which is not shown. In a state in which the print head 704 is lifted down and the squeegee 702 is pressed against the substrate 1 or clamping pieces 26a, 26b by means of the mask 51 at a predetermined attack angle, the sideward leakage baffles 744 are turned against the elastic repulsive force of the unshown twisted spring by the reactive force applied from the substrate 1 or clamping pieces 26a, 26b via the mask 51. As a result, an end surface 744a or 744b comes into contact with the mask 51. Therefore, the sideward leakage baffles 744 prevent the solder from leaking sideward to the outside of the squeegee 702 in the X-axis direction while printing. Note that the reactive force applying to the sideward leakage baffles 744 against the elastic repulsive force of the twisted spring is considerably smaller than the reactive force that applies directly from the substrate or clamping pieces 26a, 26b onto the squeegee 702. Therefore, when the feedback control is performed to obtain the printing load as the target load, the load detected by the load sensor 720 is considered as the printing load.

The configuration and operations of the solder feeding unit 60 are described next.

As shown in FIGS. 1, 3 and 4, the solder feeding unit 60 has a unit main body 602 that is attached to the squeegee unit 70 so as to be movable freely in the X-axis direction, an X-axis drive motor 604 (FIG. 4) that drives the unit main body 602 in the X-axis direction, and the solder feed controller 44 (FIG. 4) that controls the activation of the X-axis drive motor 604.

Figure 7A:
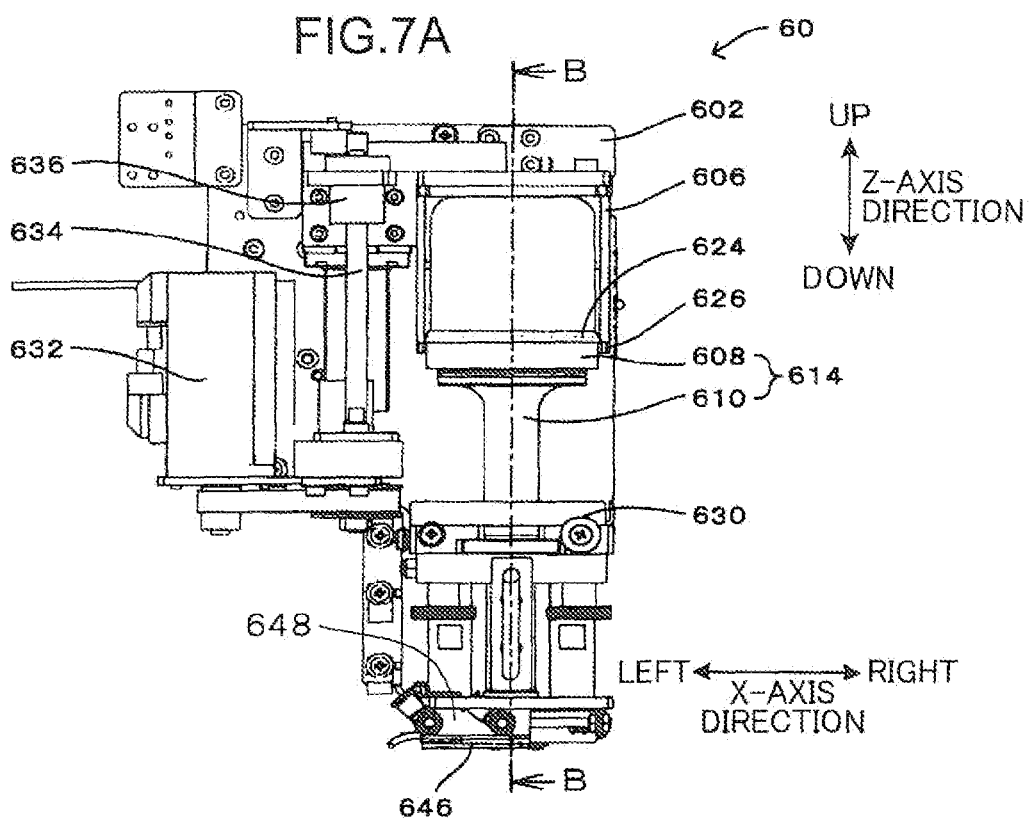
Figure 7B:
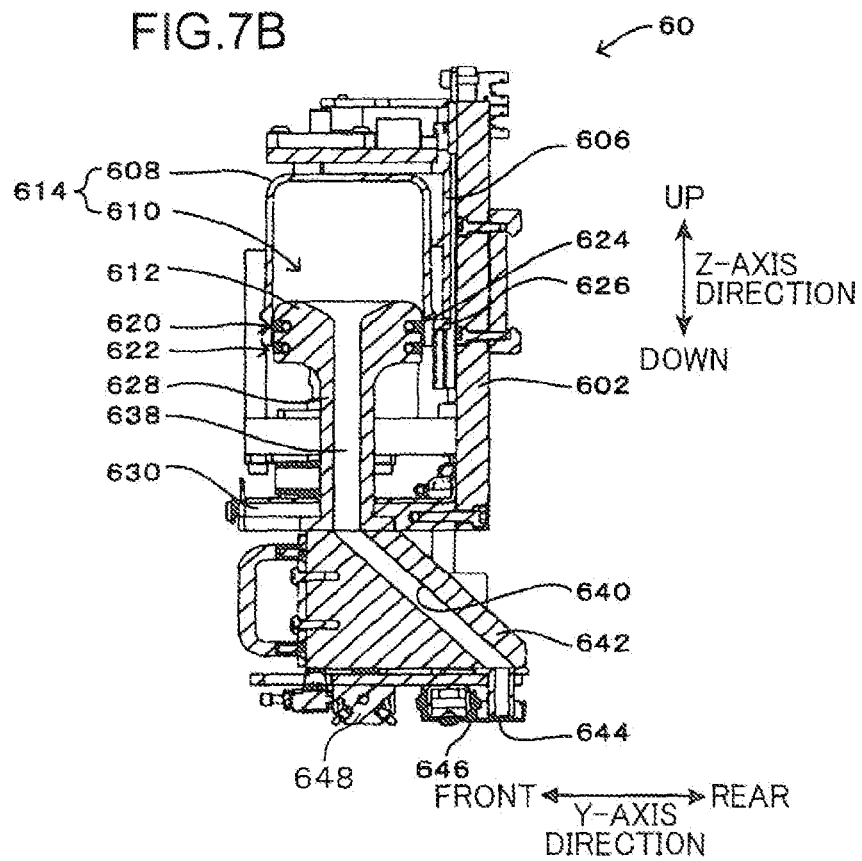
FIG. 7B is a cross-sectional diagram taken along the line B-B shown in FIG. 7A.

As shown in FIGS. 7A and 7B, a container supporting member 606 is disposed on the front side (the front side in the Y-axis direction) of the unit main body 602. A container with adopter 614 is mounted on to the container supporting member 606 so as to be detachable from the front side of the printer (on the left-hand side of FIG. 7B).

The container with adopter 614 is a unit in which an upper end part 612 of a discharge adopter 610 is fit into and assembled with a solder container 608. The solder container 608 is a cylindrical container with an opening at its lower end, and has a cavity formed therein with a substantially circular cross section. Solder is already filled in this internal space when the printer is supplied by the manufacturer.

The upper end part 612 of the discharge adopter 610 is finished into an annular piston, which is narrower than the inner diameter of the solder container 608, and can be fit into the solder container 608. The solder container 608 and the discharge adopter 610 can be moved relative to each other while the upper end part 612 is positioned along an inner wall surface of the solder container 608.

Moreover, in order to clear the gap, or ensure the sealability between the upper end part 612 and the solder container 608 when the upper end part 612 of the discharge adopter 610 is fit inside the solder container 608, two annular grooves (not shown) are formed in the upper end part 612, and sealing parts 620, 622 are mounted into the annular grooves respectively in this first embodiment. When the upper end part 612 of the discharge adopter 610 having the sealing parts 620, 622 mounted thereon is fit into the solder container 608, the upper end part 612 enters into the solder container 608 along the inner wall surface thereof, in the beginning The sealing part 620 then comes into sliding-contact with the inner wall surface of the solder container 608. When the upper end part 612 goes inside further, the sealing part 622 then comes into sliding-contact with the inner wall surface of the solder container 608, as well as the sealing part 620. As a result, these sealing parts 620, 622 ensure the sealability between the discharge adopter 610 and the solder container 608.

The container with adopter 614 is also set in the solder feeding unit 60 as follows. As shown in FIGS. 7A and 7B, a large-diameter part 624 bulging with a tapered step is formed and located at the outer circumferential lower end side of the solder container 608 of the container with adopter 614. When the container with adopter 614 is mounted on to the container supporting member 606, the large-diameter part 624 is supported in engagement with an engaging part 626 formed in the container supporting member 606. Besides, a small-diameter duct 628 continuing to the upper end part 612 is formed on the discharge adopter 610. When the container with adopter 614 is mounted on to the container supporting member 606, the duct 628 comes into engagement with a holding plate 630 connected to the unit main body 602. Thus, the solder container 608 comes into engagement with the container supporting member 606, while the discharge adopter 610 is connected to the unit main body 602 by the holding plate 630, when the container with adopter 614 is set in the solder feeding unit 60 in the manner described above.

According to the first embodiment, the container supporting member 606 is capable of moving up and down. In order to drive the container supporting member 606 up and down, a solder discharge motor 632 is attached to the unit main body 602, and a ball screw shaft 634 that is rotated in response to rotary drive force of the solder discharge motor 632 is provided vertically. A lower end of the ball screw shaft 634 is rotatably supported by the unit main body 602, while an upper end of the same is coupled to the container supporting member 606 via a bracket 636. Therefore, when the solder discharge motor 632 is activated in response to an operation command issued by the solder feed controller 44, the container supporting member 606 is moved in the vertical direction, and the solder container 608 is lifted up or down relative to the discharge adopter 610. In this manner, in the first embodiment, the discharge adopter 610 is relatively moved along the inner wall surface of the solder container 608 by lifting up the solder container 608, remaining the discharge adopter 610 fixed to the unit main body 602. Thus, when the distance between an inner bottom surface of the solder container 608 and a tip end surface of the discharge adopter 610 decreases as the solder container 608 is lifted down, the solder is extruded downwardly from the solder container 608 via a discharge hole 638 of the discharge adopter 610 by the amount corresponding to this moving distance.

A guide block member 642 formed with a guide flow path 640 is attached to the outlet side of the discharge hole 638 (the lower side of FIG. 7B). The solder that is discharged from the discharge hole 638 as described above is fed from a feed port 644 of the guide block member 642 toward the mask 51 (FIG. 3) via the guide flow path 640.

A shutter member 646 is disposed in a position near the feed port 644. This shutter member 646 moves freely between a closing position where the feed port 644 is closed and an opening position where the feed port 644 is opened, and is capable of moving between these positions by means of a solder cut cylinder 648. The solder cut cylinder 648 is controlled such that a drive command is issued from the solder feed controller 44 to a cut valve (not shown) and thereby activating a piston (not shown) of the solder cut cylinder 648 in a predetermined direction. When the solder is not fed, the solder feed controller 44 prevents solder from being fed from the feed port 644 by placing the shutter member 646 in the closing position and the. When, on the other hand, the solder needs to be fed, the solder feed controller 44 control the shutter member 646 to move to the opening position to start feeding the solder. Note that, when the feeding of the solder is to be stopped, the solder feed controller 44 controls the solder cut cylinder 648 to move the shutter member 646 to the closing position. This shutter movement cuts the continuous discharge of the solder from the feed port 644, and consequently the feeding of the solder from the feed port 644 is stopped.

According to the printer configured as described above, in the setup process prior to the start of printing, the Y-axis direction interval between the carrying-in conveyors 31, 31, the Y-axis direction interval between the conveyors 251a, 251b, and the Y-axis direction interval between carrying-out conveyors 32, 32 are adjusted in accordance with the width of the substrate 1. Furthermore, the mask frames 52 on which a new mask 51 is pasted up by the operator are disposed in a fixed manner in the frame members 11 by the mask clamp unit 50. Moreover, the squeegee holder 740 incorporated with the desired squeegee 702 is incorporated into the unit assembling part 728. In addition, the solder pool SP is formed on the surface of the mask 51 by feeding the solder from the solder feeding unit 60, based on the initial solder discharge amount stored in the data storage unit 48.

Once the print preparation process is completed as above, the arithmetic processor 41 controls each part of the printer in accordance with the print program that is stored in the program storage unit 42 beforehand, and executes the forward print process and the backward print process by alternately switching therebetween. In addition, in the first embodiment, the substrate 1 is replaced when switching between the printing processes, and at the same time the "solder amount measuring" process, "solder replenishment necessity determination" process, and "solder replenishing" process are executed each time the printing processes are switched. Therefore, the control unit 40 functions as the "solder amount measuring means," "determination means," and "replenishment control means" of the present invention, as will be described later. The printing operations and the operations associated with the solder according to the first embodiment are described hereinafter with reference to FIGS. 8 to 10.

Figure 8:
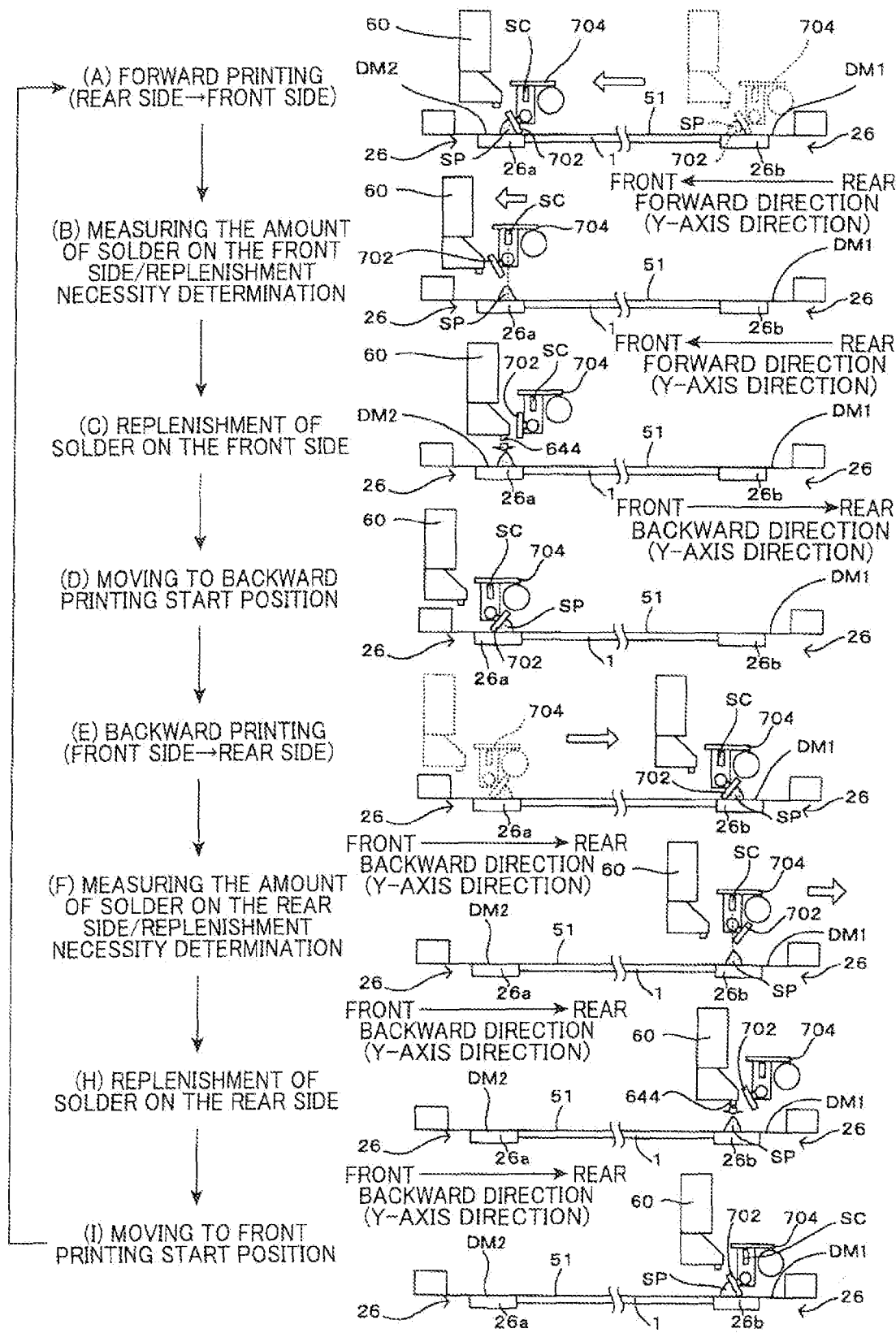
FIG. 8 is a diagram, schematically showing processes (a) to (i) of the operations performed by the printer according to the present invention.
Figure 9A:
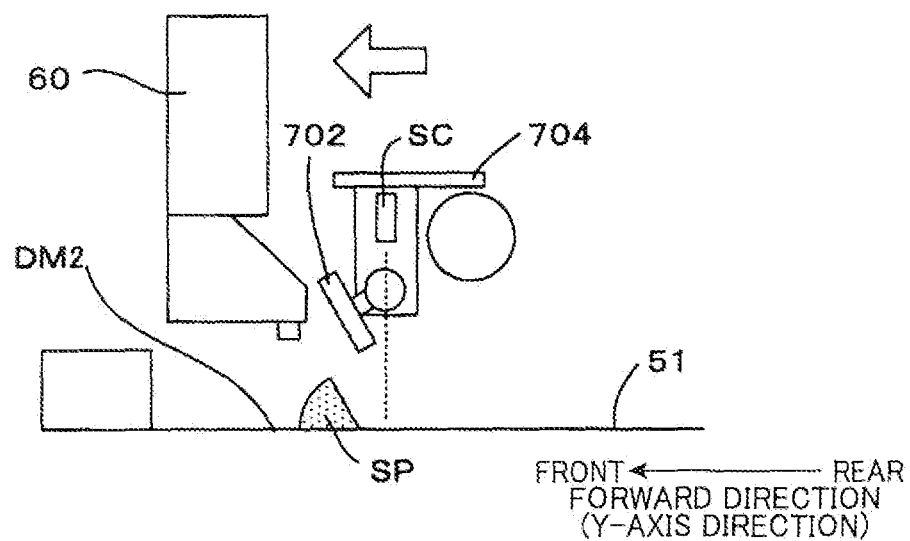
FIG. 9 is a diagram showing a timing chart of how the amount of solder is measured in a plurality of timings (a) to (c).
Figure 9B:
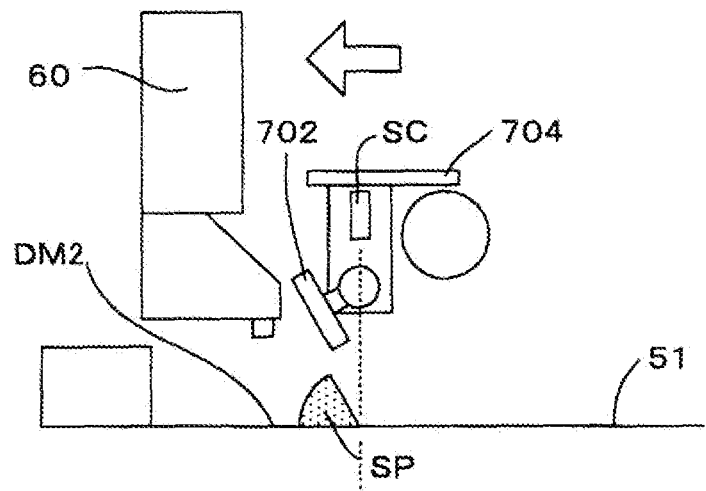
Figure 9C:
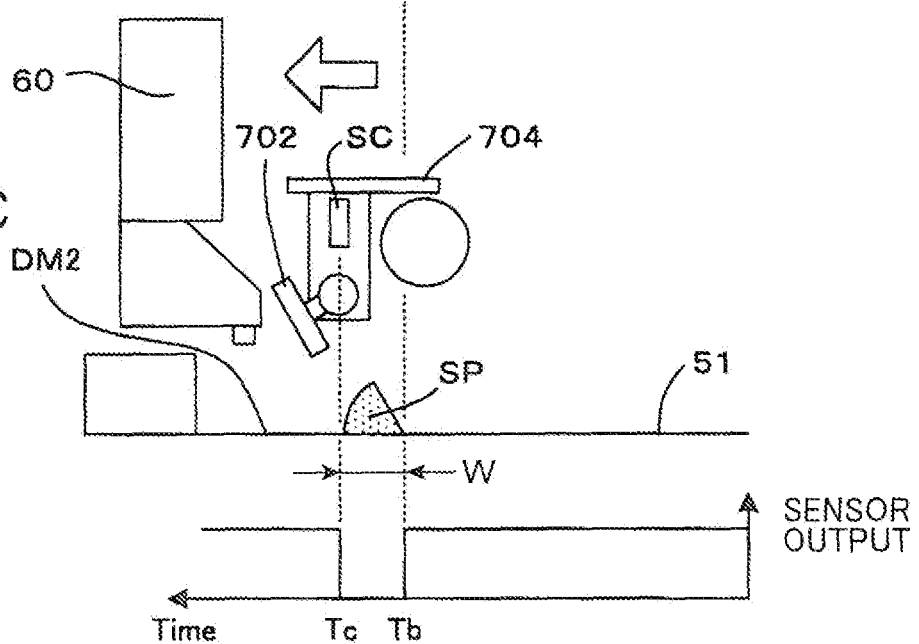

FIG. 8 is a diagram, schematically showing the operations of the printer according to the present invention. FIG. 9 is a diagram showing how the amount of solder is measured. FIG. 10 is a diagram showing the operations executed in the first embodiment by the solder feeder according to the present invention. The "forward print process" according to each embodiment refers to a printing operation where the head 704 is moved from rear side to front side in the Y-axis direction so that the solder pool SP staying at the non-opening part DM1 on the rear side of the surface of the mask 51 is moved forwardly to the non-opening part DM2 on the front side in the Y-axis direction. Also the "backward print process" refers to a printing operation where the head 704 is moved from front side to rear side in the Y-axis direction so that the solder pool SP staying at the non-opening part DM2 on the front side of the surface of the mask 51 is moved backwardly to the non-opening part DM1 on the rear side in the Y-axis direction. Furthermore, the dashed arrows shown in FIG. 10 designate the basis for calculation (relation) of the amount of solder to be replenished.

As shown in process (a) in FIG. 8, the squeegee 702 in the forward print process is brought, from the upstream side of the forward direction (the rear side in the Y-axis direction), into contact with the solder pool SP staying at the non-opening part DM1 on the rear side. In this state, the head 704 starts moving in the forward direction, so that the squeegee 702 slides on the surface of the non-opening part DM1 by a forward entrance distance. The solder is then printed onto the substrate 1 through the opening parts. The squeegee 702 further slides on the surface of the non-opening part DM2 by a forward end distance from where the squeegee 702 passes through the opening part at the most down stream of the forward direction, and consequently the head 704 stops moving.

Once the forward print process is completed, the control unit 40 replaces the substrate as shown in "the first embodiment" column in FIG. 10, or carries-in an unprocessed substrate 1 after carrying-out the processed substrate 1. At the same time, the control unit 40 executes the process of "measuring the amount of solder on the front side." This process of "measuring the amount of solder on the front side" is an operation of measuring the solder residue in the solder pool SP staying at the non-opening part DM2 on the front side. First, the head 704 is lifted up to cause the squeegee 702 to retreat to above the solder pool SP (timing (a) in FIG. 9). The squeegee 702 is then rotated in a clockwise direction on the pages of FIGS. 8 and 9, and kept at a position, on the downstream side in the forward direction (the front side in the Y-axis direction) with respect to the solder pool SP, which is the position opposite to the opening parts of the mask 51 (timing (b) in FIG. 9). In this state, the head 704 is moved in the forward direction by a distance slightly longer than the maximum set width of the solder pool SP in the Y-axis direction. A signal that is output from the solder sensor SC (sensor output) during this movement is input to the arithmetic processor 41 via the input/output controller 47. The arithmetic processor 41 measures the length of time during which the sensor SC passes above the solder pool SP and the output thereof is turned OFF (timing (c) in FIG. 9). In other words, because the sensor SC in this embodiment is a so-called light reflection type, the projected light scatters at the section on the surface of the mask 51 where the solder pool SP is formed, whereby the sensor is turned OFF. Therefore, width W of the solder pool SP is calculated based on the speed of the moving head 704 and the length of time during which the sensor is OFF (=Tc−Tb), and the result of the calculation is obtained as an index value indicating the amount of solder in the solder pool SP. The method of sensing is not limited to the method using light reflection described above. For example, a sensor that detects the height between the sensor and a detection section may be used, or any sensor can be used as long as the amount of solder in the solder pool SP can be measured.

Once the process of "measuring the amount of solder on the front side" is completed, the arithmetic processor 41 determines whether solder needs to be replenished or not. When the reduction amount of the width W of the solder pool SP is less than a predetermined value and there remains a sufficient amount of solder in the solder pool SP, the arithmetic processor 41 moves the squeegee 702 to a position for starting the backward print process, without executing the process of "replenishing solder on the front side" (process (c) in FIG. 8), but by rotating the squeegee 702 counterclockwise, moving the print head 704 to the front side in the Y-axis direction, and lifting the head 704 down (process (d) in FIG. 8). On the contrary, when the reduction amount of the width W becomes equal to or greater than the predetermined value and it is determined that the solder residue in the solder pool SP is equal to or lower than an acceptable value, the arithmetic processor 41 executes the process of "replenishing solder on the front side." This process of "replenishing solder on the front side" is an operation of using the solder feeding unit 60 to replenish with solder the solder pool SP staying at the front-side non-opening part DM2, and is executed as follows.

When "replenishing solder on the front side," the squeegee 702 is further rotated in the clockwise direction on the page of FIG. 8 to change its posture to a vertical one, so that the squeegee 702 is prevented from interfering with the solder feeding unit 60 which moves in the X-axis direction. The head 704 is then moved in the returning direction while the squeegee 702 is kept in the vertical posture, and the feed port 644 of the solder feeding unit 60 is positioned immediately above the solder pool SP. Subsequently, the feed port 644 is kept in the position above the front-side non-opening part DM2, while the shutter 646 is opened to discharge continuously the solder from the feed port 644. In this state, the solder feeding unit 60 is moved in the X-axis direction to replenish the solder pool SP evenly with solder. After replenishing the solder, the shutter 646 is closed. At the same time, the squeegee 702 is moved to the position for starting the backward print process (process (d) in FIG. 8) by replacing the substrate 1, rotating the squeegee 702 counterclockwise, moving the print head 704 to the front side in the Y-axis direction, and lifting the print head 704 down. Accordingly, the head 704 is lifted down to bring the squeegee 702 from the upstream side of the returning direction (the front side in the Y-axis direction) into contact with the solder pool SP staying at the front-side non-opening part DM2. The solder residue of the solder pool SP is constantly kept at an amount equal to or greater than a predetermined amount by executing the processes of "measuring the amount of solder on the front side," "determining the necessity of replenishing solder on the front side," and "replenishing solder on the front side."

Once the squeegee 702 is moved completely to the position for starting the backward printing, the backward print process is executed (process (e) in FIG. 8). When the backward print process is executed, the head 704 is moved in the returning direction, while the squeegee 702 is brought from the rear into contact with the solder pool SP. The squeegee 702 then slides on the surface of the non-opening part DM2 by a backward entrance distance, and thereafter the solder is printed on the substrate 1 through the opening parts. The squeegee 702 further slides on the surface of the non-opening part DM1 by a backward end distance from where the squeegee 702 passes through the opening part at the lower-most stream of the returning direction, and consequently the head 704 stops moving.

Once the backward print process is completed, the control unit 40 executes the substrate replacement as in the forward print process. Simultaneously with the substrate replacement, the control unit 40 executes the process of "measuring the amount of solder on the rear side" and the process of "determining the necessity of replenishing solder on the rear side" (process (f) in FIG. 8). This process of "measuring the amount of solder on the rear side" is an operation of measuring the solder residue in the solder pool SP staying at the rear-side non-opening part DM1, and is basically performed in the same way as the process of "measuring the amount of solder on the front side." Specifically, after lifting up the head 704 to cause the squeegee 702 to retreat to above the solder pool SP, the squeegee 702 is rotated in the counterclockwise direction on the page of FIG. 8, from the measurement position for the sensor SC to the position to which the squeegee 702 retreats. Even in this state, the squeegee 702 is positioned on the downstream side of the returning direction (the rear side of the Y-axis direction) with respect to the solder pool SP, or, in other words, on the side opposite to the opening parts of the mask 51. In this state, the head 704 is moved in the returning direction by a distance slightly longer than the maximum set width of the solder pool SP in the Y-axis direction, and the arithmetic processor 41 measures the length of time during which the sensor is OFF, based on a signal that is output from the solder sensor SC during this movement of the head 704. Subsequently, the control unit 40 calculates the width W of the solder pool SP at the rear-side non-opening part DM1 based on the speed of the movement of the head 704, and obtains the result of the calculation as an index value indicating the amount of solder in the solder pool SP.

Once the process of "measuring the amount of solder on the rear side" is completed in the manner described above, the arithmetic processor 41 determines whether solder needs to be replenished or not. When the reduction amount of the width W of the solder pool SP is less than a predetermined value and there remains a sufficient amount of solder in the solder pool SP, the arithmetic processor 41 moves the squeegee 702 to a position for starting the forward print process, without executing the process of "replenishing solder on the rear side" (process (h) in FIG. 8), but by rotating the squeegee 702 clockwise, moving the print head 704 to the front side in the Y-axis direction, and lifting the head 704 down (process (i) in FIG. 8). On the contrary, when the reduction amount of the width W becomes equal to or greater than the predetermined value and it is determined that the solder residue in the solder pool SP is equal to or lower than the acceptable value, the arithmetic processor 41 executes the process of "replenishing solder on the rear side." This process of "replenishing solder on the rear side" is an operation of using the solder feeding unit 60 to replenish with solder the solder pool SP staying at the rear-side non-opening part DM1. More specifically, the print head 704 is moved in the returning direction from the state of process (f) shown in FIG. 8, and the feed port 644 of the solder feeding unit 60 is positioned immediately above the solder pool SP. Subsequently, the feed port 644 is kept in the position above the rear-side non-opening part DM1, while the shutter 646 is opened to continuously discharge the solder from the feed port 644. In this state, the solder feeding unit 60 is moved in the X-axis direction to replenish the solder pool SP evenly with solder. After replenishing the solder, the shutter 646 is closed. At the same time, the squeegee 702 is moved to the position for starting the forward print process (process (i) in FIG. 8) by rotating the squeegee 702 clockwise, moving the print head 704 to the front side in the Y-axis direction, and lifting the print head 704 down. Accordingly, the solder residue of the solder pool SP is constantly kept at an amount equal to or greater than a predetermined amount by executing the processes of "measuring the amount of solder on the rear side," "determining the necessity of replenishing solder on the rear side," and "replenishing solder on the rear side." Once the substrate is replaced and the squeegee 702 is moved completely to the position for starting the forward print process, the forward print process is executed. From this point on as well, the above-described series of operations up to the subsequent mask replacement is repeated.

As described above, according to the first embodiment, the forward print process and the backward print process are performed by a single squeegee 702, and the amount of solder is measured while switching from the forward print process to the backward print process and while switching from the backward print process to the forward print process. When switching from the forward print process to the backward print process, the amount of solder in the solder pool SP is measured while the squeegee 702 is located on the downstream side of the forward direction (the squeegee 702 is positioned on the side opposite to the opening parts of the mask 51), which is the direction of the movement of the squeegee 702 before the printing processes are switched. When switching from the backward print process to the forward print process, the amount of solder in the solder pool SP is measured while the squeegee 702 is positioned on the downstream side of the returning direction (the squeegee 702 is positioned on the side opposite to the opening parts of the mask 51), which is the direction of the movement of the squeegee 702 before the printing processes are switched. Thus, even when the solder adhering to the squeegee 702 drips during the solder amount measurement, this solder adheres to the non-opening parts DM1, DM2 of the mask 51. For this reason, the amount of solder in the solder pool SP can be measured without employing the operation sequence that causes cycle loss.

Moreover, as described above, it is no longer necessary to cause solder pool SP to overrun excessively at the non-opening parts DM1, DM2 of the mask 51. Accordingly, the amount of solder in the solder pool SP can be measured in a short period of time, even when performing solder printing by means of not only a mask 51 with a comparatively small region provided with the opening part (at the center of the mask), but also a mask 51 with a comparatively large region provide with the opening part. Based on the amount of solder that is measured as described above, the solder pool SP is replenished with solder fed from the solder feeding unit 60 according to need. Thus, the solder residue in the solder pool SP is constantly regulated. As a result, automatic solder printing can be continuously carried out well.

According to the present embodiment, the solder amount measuring means has a plurality of sensors attached to the head, and the solder replenishment necessity determination means determines the necessity of replenishing the solder, based on a result of measurement performed by one of the plurality of sensors that is most remote from the squeegee.

The solder amount measuring means measures the width of the solder pool in a relative displacement direction, and the solder replenishment necessity determination means determines the necessity of replenishing the solder by obtaining the width of the solder pool.

Note that the present invention is not limited to the first embodiment illustrated above, and various modifications other than those mentioned above can be made without departing from the scope of the invention. For example, in the first embodiment, "solder amount measurement" is performed every time when switching between the forward print process and the backward print process, and at the same time "solder replenishment" is performed appropriately based on the result of the "solder amount measurement," as shown in FIG. 10. However, the timing for performing the "solder amount measurement" and "solder replenishment" is not limited thereto.

For example, as shown in "the second embodiment" column in FIG. 10, the "solder amount measuring" process and the "solder replenishing" process may be executed only when switching from the backward print process to the forward print process. Especially in this printer, because the solder feeding unit 60 is disposed on the front side of the print head 704 in the Y-axis direction (the left-hand side of FIG. 8), it is inevitable that the process of "replenishing solder on the front side" has more operations than the process of "replenishing solder on the rear side." Therefore, as illustrated in the second embodiment, the operations and drive control can be simplified by restricting the processes to the process of "replenishing solder on the rear side."

Furthermore, according to the first embodiment, the "solder amount measuring" process is executed, and, according to need, the "solder replenishing" process is executed immediately thereafter based on the measurement result. However, the measurement result of the "solder amount measuring" process may be stored in a memory (not shown), the printing operation may be executed once or more without carrying out the "solder replenishing" process, and thereafter the "solder replenishing" process may be performed when switching the printing operation to the subsequent printing operation. For example, as shown in "the third embodiment" column in FIG. 10, the "solder amount measuring" process may be performed when switching from the forward print process to the backward print process, the obtained measurement result may be stored in the memory, the measurement result may be read from the memory after the execution of the backward print process, and then the "solder replenishing" process may be executed according to need. In this case, the residual amount of solder discharged in a certain solder replenishing process (or the preparation process) may be calculated each time printing is carried out, based on the initial solder discharge amount, the solder reduction amount, and the limit amount of solder that are stored in the data storage unit 48. Then, the "solder amount measuring" process and the "solder replenishing" process may be executed for each number of prints obtained until the solder residue approaches the limit amount of solder. In so doing, the solder reduction amount per printing is calculated from the number of prints obtained between a certain "solder amount measuring" process and the subsequent "solder amount measuring" process, and the solder reduction amount stored in the data storage unit 48 may be updated. Alternatively, the initial solder discharge amount stored in the data storage unit 48 may be taken as a target value, and then solder may be replenished into the solder pool SP so that the solder amount in the replenished solder pool SP becomes the initial solder discharge amount before the reduced amount of solder reaches the limit amount of solder.

As shown in "the fourth embodiment" column in FIG. 10, the "solder amount measuring" process and the "solder replenishing" process may be executed each time when printing is executed on a predetermined number of substrates 1. As a result, the time require for the "solder amount measuring" process or the "solder replenishing" process can be saved, improving the print efficiency.

In addition, according to the first embodiment, the amount of solder in the solder pool SP is measured by the single sensor SC that is attached to the side surface of the sub frame 722, which is located on the side opposite to the gear box 732, as shown in FIG. 5. However, the type and the number of sensors, as well as the place for disposing the sensor, are not limited. As shown in FIG. 11, for example, sensors SC1, SC2 may be attached to the rear side and the front side of the print head 704 in the Y-axis direction, and output signals from these sensors SC1, SC2 may be used separately in accordance with the timing for measuring the amount of solder.

In this embodiment, in the process of "measuring the amount of solder on the front side," the squeegee 702 is positioned on the downstream side of the forward direction (the front side of the Y-axis direction) with respect to the solder pool SP, as shown in process (b) in FIG. 11. In this case, the sensor SC1 is more remote from the squeegee 702 than the sensor SC2. Thus, even when the rotation amount of the squeegee 702 on the downstream side of the forward direction (the front side of the Y-axis direction) is set small, the squeegee 702 can be prevented from interfering with the sensor SC1. Accordingly, the abovementioned rotation amount, or the degree in which the squeegee 702 retreats, can be held down by measuring the amount of solder in the solder pool SP using the sensor SC1, which can eventually reduce the take time. On the other hand, the process of "measuring the amount of solder on the rear side" is completely the opposite of the process of "measuring the amount of solder on the front side." In other words, as shown in process (f) in FIG. 11, the squeegee 702 is positioned on the downstream side of the returning direction (the rear side of the Y-axis direction) with respect to the solder pool SP. In this case, the sensor SC2 is more remote from the squeegee 702 than the sensor SC1. Thus, even when the rotation amount of the squeegee 702 on the downstream side of the returning direction (the rear side of the Y-axis direction) is set small, the squeegee 702 can be prevented from interfering with the sensor SC2. Accordingly, the abovementioned rotation amount, or the degree in which the squeegee 702 retreats, can be held down by measuring the amount of solder in the solder pool SP using the sensor SC2, which can eventually reduce the cycle time.

Moreover, in the embodiment, although the solder residue in the solder pool SP is calculated based on the width W of the solder pool SP in the Y-axis direction, the method of calculating the solder residue is not limited thereto. For example, when solder sensors SC, SC1, SC2 are used for detecting the height from each of sensors to a detection section, not only the width W of the solder pool SP in the Y-axis direction but also the cross section of the solder pool SP on a YZ planar surface can be measured. Here, when such sensors are used as the "solder amount measuring means" of the present invention, the solder residue may be obtained based on the cross-sectional area of the solder pool SP.

The embodiment described above merely illustrates the preferred specific examples of the present embodiment, and the present invention is not limited to the embodiment illustrated above. It goes without saying that various modifications can be made within the scope of the present invention.

The invention claimed is:

1. A solder feeder in a printer, wherein the solder feeder is adapted to replenish a solder pool with solder, and the printer is adapted to execute alternately a forward print process and a backward print process, said printer comprising:
   only one squeegee supported on a head,
   a drive source fixed to the head, the drive source is adapted to drive the squeegee so that the squeegee is brought into contact with the solder pool from an upstream side of a forward direction when the forward print process is executed, and to drive the same squeegee so that the same squeegee is brought into contact with the solder pool from a downstream side in a forward direction when the backward print process is executed,
   wherein, in the forward print process, the squeegee is configured to press the solder pool on a surface of a mask from the upstream side in the forward direction while moving the head relatively along the surface of the mask in the forward direction to apply solder onto a substrate through the opening part of the mask of which lower surface is put on the top of the substrate, and
   wherein, in the backward print process, the same squeegee is adapted to press the solder pool from the upstream side in a returning direction while moving the head relatively along the surface of the mask to apply solder onto a substrate through the opening part of the mask,
   the solder feeder comprising:
   solder feeding means for feeding the solder;
   solder amount measuring means, attached to the head, for measuring an amount of solder in the solder pool when the squeegee passes through the solder pool on the downstream side in a moving direction before switching in a process where switching is made from any one of the forward print process and backward print process to the other;
   solder replenishment necessity determination means for determining whether solder replenishment is required, based on the amount of solder measured by the solder amount measuring means; and
   replenishment control means for controlling the solder feeding means to replenish the solder pool with the solder, based on a result of the determination made by the solder replenishment necessity determination means.

2. The solder feeder according to claim 1, wherein
   the solder amount measuring means has a plurality of sensors attached to the head, and
   the solder replenishment necessity determination means determines the necessity of replenishing the solder, based on a result of measurement performed by one of the plurality of sensors that is most remote from the squeegee.

3. The solder feeder according to claim 1, wherein
   the solder amount measuring means measures a width of the solder pool in a relative displacement direction, and the solder replenishment necessity determination means determines the necessity of replenishing the solder by obtaining the width of the solder pool.

4. A printer comprising:

printing means for executing alternately a forward print process, in which only one squeegee supported on a head presses a solder pool staying on a surface of the mask from the upstream side in a forward direction while moving the head relatively along the surface of the mask in the forward direction to apply solder onto a substrate through the opening part of the mask of which lower surface is put on the top of the substrate, and a backward print process, in which the same squeegee presses the solder pool from the upstream side in a returning direction while moving the head relatively along the surface of the mask to apply solder onto a substrate through the opening part of the mask;

a drive source fixed to the head, the drive source is adapted to drive the squeegee so that squeegee is brought into contact with the solder pool from the upstream side of the forward direction when the forward print process is executed, and the drive source is adapted to drive the same squeegee so that the same squeegee is brought into contact with the solder pool from the downstream side in the forward direction when the backward print process is executed;

solder feeding means for feeding the solder;

solder amount measuring means, attached to the head, for measuring an amount of solder in the solder pool when the squeegee passes through the solder pool on the downstream side in a moving direction before switching in a process where switching is made from any one of the forward print process and backward print process to the other;

solder replenishment necessity determination means for determining whether the solder pool needs to be replenished with solder, based on a result of the measurement performed by the solder amount measuring means; and replenishment control means for controlling the solder feeding means to replenish the solder pool with the solder, based on a result of the determination made by the solder replenishment necessity determination means.

5. A printing method comprising steps of:

a forward print process in which a squeegee supported on a head presses a solder pool staying on the surface of the mask from the upstream side in a forward direction while moving the head relatively along the surface of the mask in the forward direction, in order to apply solder onto a substrate through the opening part of the mask of which lower surface is put on the top of the substrate;

a backward print process in which the squeegee presses the solder pool from the upstream side in a returning direction while moving the head relatively along the surface of the mask in the returning direction, in order to apply solder onto a substrate through the opening part of the mask;

a switching process of switching a position of the squeegee in relation to the solder pool when alternately switching between the forward print process and the backward print process;

a solder amount measuring process of measuring an amount of solder in the solder pool when the squeegee passes through the solder pool on the downstream side in a moving direction before switching in a process where switching is made from any one of the forward print process and backward print process to the other;

a solder replenishment necessity determination process of determining whether solder replenishment is required, based on a result of the measurement performed in the solder amount measuring process; and a replenishing process of replenishing the solder pool with the solder, based on a result of the determination made in the solder replenishment necessity determination process.

* * * * *